CIRCUIT FOR STABILIZING THE DC OUTPUT VOLTAGE OF A GAIN CONTROLLED AMPLIFIER STAGE IN A DIRECT COUPLED INTEGRATED CIRCUIT SIGNAL TRANSLATING SYSTEM

Filed Nov. 29, 1965

INVENTOR.
LEOPOLD A. HARWOOD
BY Eugene M. Whitacre
ATTORNEY

United States Patent Office 3,430,154

Patented Feb. 25, 1969

3,430,154

CIRCUIT FOR STABILIZING THE DC OUTPUT VOLTAGE OF A GAIN CONTROLLED AMPLIFIER STAGE IN A DIRECT COUPLED INTEGRATED CIRCUIT SIGNAL TRANSLATING SYSTEM

Leopold A. Harwood, Somerville, N.J., assignor to Radio Corporation of America, a corporation of Delaware Filed Nov. 29, 1965, Ser. No. 510,226

U.S. Cl. 330—19 9 Claims

Int. Cl. H03f 3/42, 3/04, 3/14

ABSTRACT OF THE DISCLOSURE

Stabilization of the DC output voltage of a gain controlled amplifier stage in a direct coupled integrated circuit signal translating system by means of a control circuit which supplies a direct current through the amplifier load resistance that varies, in response to the gain control signal, in the same amount as does the amplifier supplied current in response to that signal, but in an opposite direction.

Figure 1:
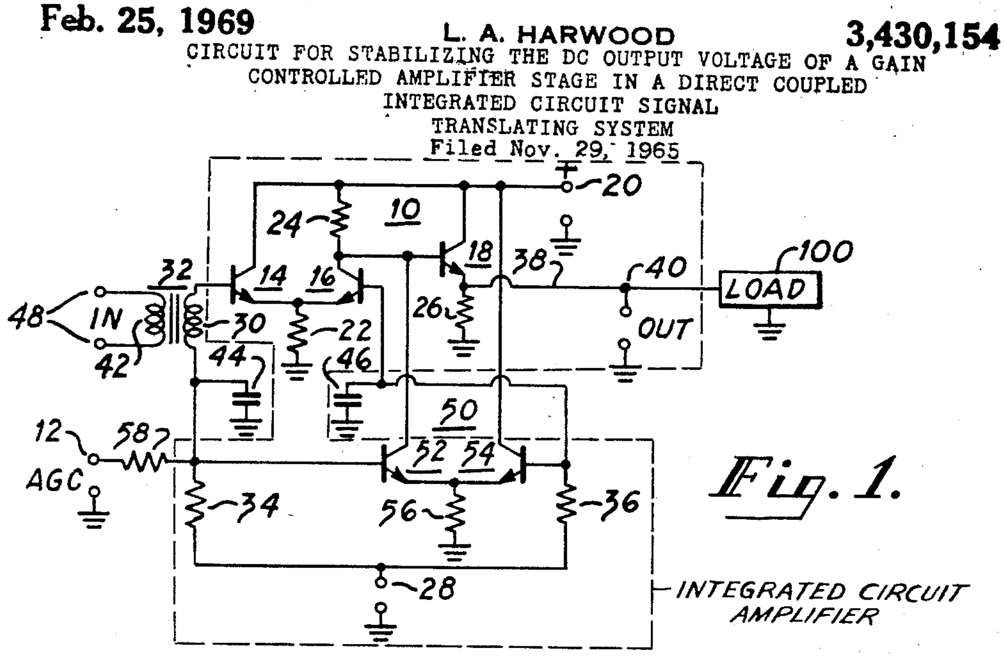

This invention relates to signal control apparatus, in general, and to automatic gain control arrangements for integrated circuits, in particular.

As used herein, the term integrated circuit refers to a unitary or monolithic semiconductor device or chip which is the equivalent of a network of interconnected active and passive circuit elements. Various problems have presented themselves in the design of such a semiconductor device. One problem, that of cascading resistance-capacitance coupled amplifiers, stems from the fact that an integrated circuit capacitor occupies a considerable area of the semiconductor chip, even for a relatively small amount of capacitance. Since the physical dimensions of the chip are limited, the size of the capacitor, and hence the amount of capacitance available for interstage coupling, must also be limited. Restricting the size of the capacitor, however, limits not only the low frequency response of the amplifier, but the high frequency response as well and, therefore, the gain at the desired signal frequency; and because of the parasitic shunt capacitance existing across the integrated circuit capacitor structure, the high frequency response of the amplifier will be limited still further. What with the limitations in the processing techniques presently used for fabricating integrated circuit capacitors, in addition, these size restrictions may be a substantial source of trouble due to shorting between the plates of the capacitor. Consequently, it would be desirable to direct current (D.C.) couple amplifier stages in integrated circuit design wherever possible.

The cascading of D.C. coupled amplifier stages, however, offers problems of its own. For example, since the D.C. voltage appearing at the output electrode of one stage comprises the input voltage for the next succeeding stage, complicated biasing networks are needed to establish the desired operating points for each of the cascaded stages. D.C. feedback is generally necessary to maintain each operating point stable, and where substantial gain is to be effected in a single integrated circuit device, the phase shifts within the D.C. feedback loop are such as to increase the likelihood of circuit instability. Before D.C. coupled amplifier stages can be cascaded effectively in signal receiving systems employing automatic gain control apparatus, in addition, provision must be made to prevent the automatic gain control action from affecting the operating point of any stage but the one whose gain is to be controlled. Otherwise, instability of amplifier operation may result which, if the gain is sufficiently high, can ultimately render the amplifier totally inoperative.

It is an object of the present invention to provide improved automatic gain control apparatus for signal receiving systems and, particularly, apparatus which does not upset the operating point stability of D.C. coupled integrated circuit amplifiers included as a part thereof.

As will become clear hereinafter, such apparatus includes a control circuit for offsetting the changes in the D.C. output voltage of the gain controlled amplifier stage resulting from current variations in that stage brought about by automatic gain control action.

For a better understanding of the present invention, together with further objects thereof, reference is had to the following description, taken in connection with the accompanying drawings, and its scope will be pointed out in the appended claims.

Figure 2:
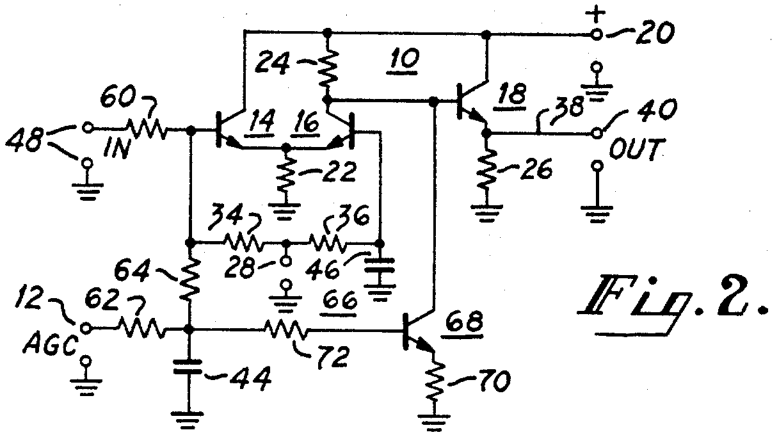
Figure 3:
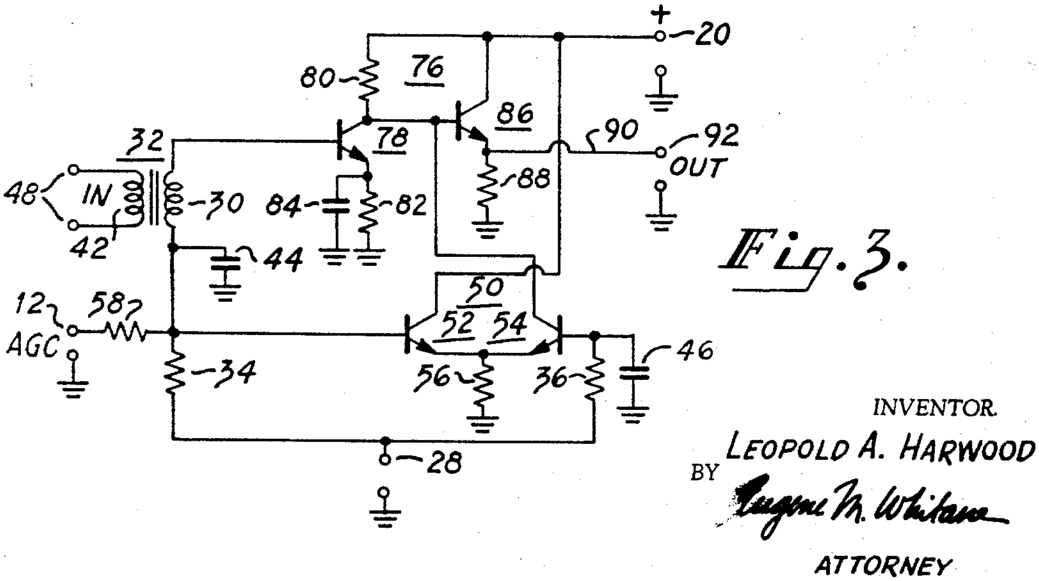

In the drawings:

FIGURE 1 is a schematic circuit diagram of a signal translating circuit embodying the invention; and FIGURES 2 and 3 are schematic circuit diagrams of modifications of the signal translating circuit of FIGURE 1.

Referring now more particularly to FIGURE 1, the arrangement there shown includes a D.C. amplifier stage 10, the gain of which is to be automatically adjusted in response to a control signal applied to the input terminals 12. The amplifier 10 may represent the first stage of a multi-stage D.C. coupled intermediate frequency amplifier of a radio signal receiver, for example, with the automatic gain control signal being developed in response to variations in signal intensity. The amplifier stage 10 includes three transistors 14, 16 and 18. One transistor 14 is arranged in a common collector configuration, with its collector electrode connected to an energizing potential terminal 20 and with its emitter electrode connected to a point of reference potential, e.g. ground, through a resistor 22. A second transistor 16 is arranged in a common base configuration, with its collector electrode connected to the potential terminal 20 through a resistor 24 and with its emitter electrode connected to ground through the resistor 22. The third transistor 18 is arranged in a common collector configuration, with its collector electrode connected to the terminal 20 and with its emitter electrode connected to ground through a resistor 26.

The base electrode of transistor 14 is connected to an energizing or bias potential terminal 28 through the secondary winding 30 of a signal input transformer 32 and a resistor 34 while the base electrode of transistor 16 is connected to the potential terminal 28 through a resistor 36 of substantially the same resistance value as the resistor 34. The collector electrode of transistor 16 is also connected to the base electrode of transistor 18, the emitter electrode of which is connected via a conductor 38 to an output terminal 40 to which an appropriate load 100 may be connected. Load 100 may include one or more amplifier stages similar in construction to that represented by the numeral 10, for example, and, as such, will then comprise together with stage 10, a multi-stage D.C. coupled amplifier.

Signals to be amplified by the stage 10 are applied across the primary winding 42 of the input transformer 32 via terminals 48 and are coupled through the secondary winding 30 to the base electrode of transistor 14. The end of the winding 30 remote from the base electrode of transistor 14 is grounded for signal frequencies through a by-pass capacitor 44, as is the base electrode of transistor 16 through a by-pass capacitor 46. With resistor 34 and 36 equally proportioned, as described above, the transistors 14 and 16 are effectively biased so that under zero signal conditions equal currents flow in their respective collector-emitter paths.

The amplifier circuit so described essentially comprises an emitter coupled amplifier stage driving a common collector stage. That is, with proper polarity potential sources connected between terminals 20 and ground, and 28 and ground, signals supplied to input terminals 48 are amplified first by the combination of transistors 14 and 16 and then by the transistor 18. Amplified signals are thus developed across the common collector stage resistor 26 and appear as such at the output terminal 40. Under zero signal conditions, a D.C. voltage appears at the output terminal 40 which is essentially equal to the quiescent operating voltage at the collector electrode of transistor 16 less the $V_{be}$ voltage drop of transistor 18. As used herein, the term $V_{be}$ voltage represents the average base-to-emitter voltage of a transistor which is operating as the active device in an amplifier circuit or the like. For silicon transistors, this $V_{be}$ voltage is approximately 0.7 volt, which is within the range for Class A amplification.

A D.C. control voltage or, more particularly, an automatic gain control (AGC) signal is supplied to input terminal 12 in the arrangement of FIGURE 1 to maintain the amplified signals developed at output terminal 40 within a narrow intensity range for a wide range of signal intensities at the input terminals 48. This AGC signal may be supplied from any type source which develops a D.C. signal in response to received signal intensities beyond a predetermined amplitude value. As shown in FIGURE 1, the AGC signal is coupled through a resistor 58 and the secondary winding 30 of the input transformer 32 to the base electrode of transistor 14.

As is well known, the gain of an amplifier stage, such as that shown in FIGURE 1, can be adjusted by varying the transconductance or $g_m$ of the stage. Consider, for example, the case where the gain of the amplifier 10 is to be reduced in order to counteract increases in received signal intensity above the predetermined amplitude value. It will be assumed that in such an instance, the AGC signal supplied to input terminal 12 decreases in value (goes more negative). Thus, the AGC signal decreases the bias voltage applied to the base electrode of transistor 14, decreases the quiescent current flow through transistor 14, decreases the voltage drop across resistor 22, and increases the quiescent current flow through transistor 16, in that order. In the present circuit, the decrease in current through the transistor 14 is substantially equal to the increase in current through the transistor 16. With the transistor 16 initially biased at an operating point such that an increase in its quiescent current reduces its transconductance, it will be noted that the effect of the AGC action is to decrease the gain of the amplifier 10, as desired.

It will also be noted that such AGC action increases the voltage drop across resistor 24, decreases the quiescent current flow through transistor 18, and decreases the voltage drop across resistor 26. Thus, besides reducing the gain of the amplifier stage 10 to counter-balance increases in signal strength, the AGC signal supplied to terminal 12 reduces the quiescent voltage developed at the output terminal 40. If the load circuit connected across output terminal 40 and ground represents a second D.C. coupled amplifier stage, for example, then this change in quiescent voltage will have the effect of changing the bias voltage therein established. The result will be an upset in the operating stability of that second amplifier stage which, if the change in bias voltage is sufficiently great, can render that stage totally inoperative.

In order to maintain the stability of operation of this second and any further amplifier stages constant, the signal translating arrangement of FIGURE 1 also includes a control circuit 50 for offsetting the changes in the quiescent voltage at output terminal 40 brought about by the AGC action. The circuit 50 includes a pair of transistors 52 and 54. One transistor 52 is connected in a common emitter configuration with its collector electrode connected to the energizing potential terminal 20 through the resistor 24 and with its emitter electrode connected to the ground reference potential point through a resistor 56 of substantially the same resistance value as the resistor 22. The other transistor 54 is connected in a common collector configuration, with its collector electrode connected to the potential terminal 20 and with its emitter electrode connected to ground through the resistor 56. The base electrode of transistor 52 is connected to the energizing potential terminal 28 through the resistor 34 while the base electrode of transistor 54 is connected to the potential terminal 28 through the resistor 36. The base electrode of transistor 52 is also connected to the AGC signal input terminal 12 through the resistor 58.

With transistors 14, 16, 52 and 54 having similar characteristics, it will be noted that equal currents flow through each under zero signal conditions. Such equality may exist in monolithic silicon integrated circuits, for example, where all four transistors are formed on the same semiconductor chip. It will be noted that the resistors, the transistors and the interconnections of FIGURE 1 can easily be fabricated on an integrated circuit chip, with the capacitors 44 and 46 and the transformer 32 being coupled thereto via a plurality of contacts around the periphery of the chip.

Referring once again to the signal translating arrangement of FIGURE 1, the AGC signal supplied to input terminal 12, and coupled to the base electrode of transistor 14 to reduce the gain of amplifier 10, is also coupled to the base electrode of transistor 52. This AGC signal decreases the bias voltage applied to the base electrode of transistor 52 and decreases the quiescent current flow through transistor 52. Because of the substantial identity existing between the amplifier stage 10 and the compensating circuit 50, however, this decrease in quiescent current flow through transistor 52 is effectively equal to the increase in quiescent current flow through transistor 16 due to the AGC action. Since the currents of transistors 16 and 52 each flow through the resistor 24, the net result is that the current flow through that resistor remains substantially unchanged. Thus, the voltage drop across resistor 24, the voltage drop across resistor 26 and the quiescent voltage developed at the output terminal 40 are each maintained constant. The output voltage at terminal 40 can then be used to aid in biasing succeeding amplifier stages without introducing problems of operating instability.

It will be appreciated that if, in FIGURE 1, an AGC signal is applied to the transistors 14 and 52 that increases their conductivity instead of decreasing it, as assumed, the conductivity of transistor 16 will correspondingly decrease and the gain of the amplifier stage 10 will be reduced if transistor 16 is biased at an operating point such that a decrease in its quiescent current reduces its transconductance. The increase in quiescent current flow through transistor 52, will, however, offset the decrease in quiescent current flow through transistor 16 so as to maintain a substantially constant current flow through resistor 24 and output voltage at terminal 40.

Referring now to FIGURE 2, the signal translating arrangement there shown includes a D.C. amplifier stage which is identical in all respects to the amplifier stage 10 of FIGURE 1 except in the ways in which the signals to be amplified and the AGC signal are applied. (Those numerals used to designate the various components of the amplifier stage 10 of FIGURE 1 are therefore used to identify similar components in FIGURE 2.) In FIGURE 2, the signals to be amplified are coupled to the base electrode of transistor 14 through the resistor 60 while the AGC signal is coupled to that electrode through resistors 62 and 64. The amplifying and automatic gain control operations are performed in the FIGURE 2 arrangement in much the same manner as was previously described with reference to FIGURE 1. Thus, considering the amplifier stage 10 by itself, both the quiescent current flowing through resistor 24 and the quiescent voltage developed at output terminal 40 vary as a function of the control signal supplied at AGC input terminal 12.

The arrangement of FIGURE 2, however, also includes a control circuit 66 for offsetting these variations so as to adapt the circuit 10 for use in a multistage D.C. coupled amplifier environment. The circuit 66, moreover, is modified somewhat from the corresponding circuit 50 of FIGURE 1. In particular, it employs one transistor 68 instead of the previously used two transistors, with the collector electrode of that one transistor connected to the energizing potential terminal 20 through the resistor 24 and with the emitter electrode of that transistor connected to ground through a resistor 70. The base electrode of transistor 68 is connected to the AGC input terminal 12 through a resistor 72 of substantially the same resistance value as the resistor 64 and the coupling resistor 62. Resistors 22, 64, 70 and 72 are so selected that under zero signal (maximum gain) conditions, equal currents flow through each of the transistors 14, 16 and 68.

With the arrangement of FIGURE 2 constructed as described, it will be apparent that any change in AGC signal at the terminal 12 produces equal but opposite changes in current in the transistors 16 and 68. The net current flowing through resistor 24 continues to remain unchanged, however. Thus, whereas the change in current in transistor 16 alters its transconductance, and therefore the gain of the amplifier circuit 10 in response to the control signal, the change in current in transistor 68 maintains the quiescent voltage at the output terminal 40 constant. Here too, then, succeeding amplifier stages can be D.C. coupled to the circuit 10 without having their operating points rendered unstable by AGC action.

It will be appreciated that the signal input circuit of FIGURE 2 can just as easily be used in the signal translating arrangement of FIGURE 1. In such a situation, the base electrodes of transistors 14 and 52 will be directly connected while input signals can be supplied to the base electrode of transistor 14 through a coupling resistor. This, basically, is the scheme shown in FIGURE 2.

Referring to FIGURE 3, the signal translating arrangement there shown includes a D.C. amplifier circuit 76 which is modified somewhat from the amplifier circuit 10 of FIGURE 1. More particularly, the circuit essentially comprises a common emitter amplifier stage, instead of an emitter coupled amplifier stage, driving an output common collector stage. The common emitter amplifier portion includes a transistor 78 having its collector electrode connected to the energizing potential terminal 20 through a resistor 80 and its emitter electrode connected to ground through a parallel biasing network comprising a resistor 82 and a capacitor 84. The common collector stage, includes a transistor 86 having its collector electrode connected to the potential terminal 20 and its emitter electrode connected to ground through a resistor 88. The collector electrode of transistor 78 is also connected to the base electrode of transistor 86, the emitter electrode of which is additionally connected via a conductor 90 to an output terminal 92. Signals to be amplified are applied across the primary winding 42 of the input transformer 32 and coupled by means of the secondary winding 30 to the base electrode of transistor 78 while AGC signals are coupled to that base electrode through input terminal 12, resistor 58 and the secondary winding 30.

The current stabilizing circuit of the FIGURE 3 arrangement, on the other hand, is identical in all respects to the corresponding circuit of FIGURE 1 except in the ways in which the collector electrodes of the transistors employed are connected. (Those numerals used to designate the various components of the circuit 50 of FIGURE 1 are therefore used to identify similar components in FIGURE 3.) In FIGURE 3, the collector electrode of transistor 52 is connected to the energizing potential terminal 20 directly while the collector electrode of transistor 54 is connected to the terminal 20 through the resistor 80. Resistors 34, 36, 56 and 82 are so selected that under zero signal conditions, equal currents flow through each of the transistors 52, 54 and 78.

It will be readily apparent from FIGURE 3 that an AGC signal supplied to input terminal 12 to change the current in transistor 78 so as to modify the transconductance of that transistor and hence, the gain of the amplifier 76, causes a change in the same direction in the current in transistor 52 but an oppositely directed change in the current in transistor 54. It will also be apparent that by virtue of the particular bias arrangements employed for the transistors 52, 54 and 78, these current changes are all equal in magnitude. The total current flowing through resistor 80 is, therefore, substantially unchanged. As a result, though the AGC signal has a tendency by itself to change the D.C. output voltage of the amplifier 76, that tendency is counteracted by the compensating circuit 50, the overall effect being that the D.C. output voltage developed at terminal 92 remains constant. Thus, the operating point stabilities of circuits D.C. coupled to output terminal 92 are, here too, unaffected by, and independent of, AGC action.

The operating point stability of these circuits can be improved upon still further. The pending application, Ser. No. 396,140, filed Sept. 14, 1964 and entitled "Signal Translating System" describes an amplifier stage represented in FIGURE 1 by the numeral 10 and points out that if the resistor denoted in FIGURE 1 as 24 is twice the value of the resistor 22, then for zero bias voltages, the amplifier stage will develop a substantially constant output voltage, even in the presence of power supply voltage and environmental temperature variations. The co-pending application, Ser. No. 510,307, filed concurrently with this application and entitled "Electrical Circuit" describes in FIGURE 1 thereof a biasing circuit which produces an output D.C. potential which is a constant one-half fraction of the power supply voltage independent of the above-mentioned variations. FIGURE 3 of that co-pending application and the description with respect thereto points out that the amplifier of the 396,140 application will continue to develop a substantially constant output voltage when voltages of one-half the power supply potential are provided by the circuit of FIGURE 1 to bias that amplifier. It will be found that by selecting resistor 24 in FIGURE 1 of this application to be twice the value of resistor 22, and by connecting the energizing potential terminal 28 to the output terminal of the biasing circuit of FIGURE 1 of that co-pending application, the operation of the AGC arrangement of FIGURE 1, here, will also be independent of power supply voltage and temperature changes. This follows because the bias voltages applied to the base electrodes of transistors 52 and 54 will likewise be independent of such changes so that the circuit 50 will provide constant current compensation solely in response to changes in the AGC signal supplied to input terminal 12.

The specific arrangement for controlling the gain of a D.C. coupled amplifier may differ somewhat from those shown in FIGURES 1–3 without departing from the scope of the invention. Another arrangement for controlling the gain while maintaining the output voltage constant is shown in the co-pending application entitled, "Signal Translating System," Ser. No. 510,212, filed concurrently with this application.

What is claimed is:

1. In combination with a signal translating circuit including a first transistor amplifier stage responsive to input signals supplied for amplification via a first input base electrode thereof and operative to produce changes in a direct curent flowing through a load resistor included therein in response to changes in a gain control signal supplied to said stage via said same first input base electrode, apparatus for offsetting said changes comprising:

a second transistor amplifier stage connected to provide an additional direct current flowing through said resistor and operative in response to said gain control signals to produce changes in said current in a direction opposite to the changes produced by said first transistor amplifier stage;

a source of gain control signals;

means or coupling said gain control signals to said first amplifier stage via said first input base electrode and to said second amplifier stage;

and means for biasing said second transistor amplifier stage to cause said opposite direction current changes to substantially equal said undesirable current changes.

2. A signal translating circuit comprising:

first, second, third and fourth transistors, each having an emitter electrode, a base electrode and a collector electrode;

first and second terminals adapted to be connected to a source of energizing potential and to a source of bias potential respectively;

direct current connections from the collector electrodes of said first and said fourth transistors to said first terminal;

a first resistor connected between the emitter electrodes of said first and said second transistors and a point of reference potential;

a second resistor connected between the collector electrodes of said second and said third transistors and said first terminal;

a third resistor connected between the emitter electrodes of said third and said fourth transistors and said point of reference potential;

a fourth resistor connected between the base electrodes of said first and said third transistors and said second terminal;

a fifth resistor connected between the base electrodes of said second and said fourth transistors and said second terminal;

means for supplying signals to be amplified to the base electrode of said first transistor;

and means for supplying an automatic gain control signal to the base electrodes of said first and said third transistors;

said first, second, third and fourth transistors and said first, third, fourth and fifth resistors being so selected that the changes in direct current flowing from said second and said third transistors through said second resistor in response to said control signal are substantially equal in magnitude and opposite in direction.

3. A signal translating circuit as defined in claim 2 in which said first, second, third and fourth transistors have similar operating characteristics and in which said first and said third resistors and said fourth and said fifth resistors are of substantially the same resistance value.

4. A signal translating circuit as defined in claim 2 in which there is also included a fifth transistor having a collector electrode direct current connected to said first terminal, an emitter electrode connected to said point of reference potential through a sixth resistor and to a signal output terminal, and a base electrode direct current connected to the collector electrode of said second transistor.

5. A signal translating circuit comprising:

first, second and third transistors, each having an emitter electrode, a base electrode and a collector electrode;

first and second terminals adapted to be connected to a source of energizing potential and to a source of bias potential, respectively;

a direct current connection from the collector electrode of said first transistor to said first terminal;

a first resistor connected between the emitter electrodes of said first and said second transistors and a point of reference potential;

a second resistor connected between the collector electrodes of said second and said third transistors and said first terminal;

a third resistor connected between the emitter electrode of said third transistor and said point of reference potential;

fourth and fifth resistors respectively connected between said second terminal and the base electrodes of said first and said second transistors;

means for supplying input signals to be amplified to the base electrode of said first transistor;

and means including sixth and seventh resistors for supplying an automatic gain control signal to the base electrodes of said first and said third transistors;

said first, second and third transistors and said first, third, fourth, fifth, sixth and seventh resistors being so selected that the changes in direct current flowing from said second and said third transistors through said second resistor in response to said control signal and are substantially equal in magnitude and opposite in direction.

6. A signal translating circuit comprising:

first, second and third transistors, each having an emitter electrode, a base electrode and a collector electrode;

first and second terminals adapted to be connected to a source of energizing potential and to a source of bias potential, respectively;

a first resistor connected between the collector electrodes of said first and said third transistors and said first terminal;

a direct current connection from the collector electrode of said second transistor to said first etrminal;

a second resistor connected between the emitter electrode of said first transistor and a point of reference potential;

a third resistor connected between the emitter electrodes of said second and said third transistors and said point of reference potential;

a fourth resistor connected between the base electrodes of said first and said second transistors and said second terminal;

a fifth resistor connected between the base electrode of said third transistor and said second terminal;

means for supplying input signals to be amplified to the base electrode of said first transistor;

and means for supplying an automatic gain control signal to the base electrodes of said first and said second transistors;

said first, second and third transistors and said second, fourth and fifth resistors being so selected that the changes in direct current flowing from said first and said third transistors through said first resistor in response to said control signal are substantially equal in magnitude and opposite in direction.

7. In an integrated circuit amplifier configuration of the type including: (a) an input transistor having a collector electrode directly connected to an energizing potential terminal, an emitter electrode connected to a point of reference potential by means of a coupling resistor and a base electrode connected to a source of input signals to be amplified; (b) an intermediate transistor having a collector electrode connected to said potential terminal by means of a load resistor, an emitter electrode connected to said point of reference potential by means of said coupling resistor and a base electrode; and (c) an output transistor having a collector electrode directly connected to said first terminal, an emitter electrode connected to said point of reference potential by means of an output resistor and a base electrode directly connected to the collector electrode of said intermediate transistor, a current stabilizing circuit for offsetting any changes in direct current flowing through said load resistor in response to automatic gain control signals supplied to the base electrode of said input transistor comprising:

first and second transistors incorporated as part of said integrated circuit amplifier configuration, each having an emitter electrode, a base electrode and a collector electrode;

a direct current connection from the collector electrode of said first transistor to the collector electrode of said intermediate transistor;

a first resistor connected between the emitter electrodes of said first and said second transistors and said point of reference potential, and being substantially of the same resistance value as said coupling resistor;

a direct current connection from the collector electrode of said second transistor to said energizing potential terminal;

a source of bias potential for said first and said second transistors;

second and third resistors of substantially the same resistance value connected between said bias potential source and the base electrodes of said first and said second transistors, respectively;

a direct current connection from the base electrode of said first transistor to the base electrode of said input transistor; and a direct current connection from the base electrode of said second transistor to the base electrode of said intermediate transistor.

8. In an integrated circuit amplifier configuration of the type described in claim 7 wherein said load resistor is twice the resistance value of said coupling resistor, a current stabilizing circuit as defined in said claim in which said bias potential source supplies a direct current voltage that is substantially constant and equal to one-half the voltage at said energizing potential terminal, independent of temperature variations and independent of voltage variations at said terminal.

9. A signal translating system comprising:

a multi-stage direct current coupled transistor amplifier, one stage of which is adapted to receive automatic gain control signals at an input base electrode thereof and arranged to produce a direct current flow through a load resistor included therein;

means including said resistor for biasing each stage of said transistor amplifier following said one stage at predetermined points of operation;

means for supplying input signals to said transistor amplifier at said same input base electrode for amplification and for translation to a signal output terminal;

means for supplying automatic gain control signals to said one stage via said input base electrode to limit the amplitude range of signals developed at said output terminal, said control signals thereby changing the direct current flow through said resistor and undesirably changing the bias applied to said following transistor amplifier stages;

a current stabilizing transistor circuit arranged to produce an additional direct current flow through said load resistor and of such construction as to produce changes in said additional current in response to supplied automatic gain control signals in a direction opposite to the changes produced by said one transistor amplifier stage;

means for coupling said supplied automatic gain control signals to said stabilizing transistor circuit;

and means for biasing said circuit to cause said opposite direction current changes to substantially equal said undesirable current changes for stabilizing the bias applied to said following transistor amplifier stages.

References Cited

UNITED STATES PATENTS

| | | | |
|---|---|---|---|
| 3,141,137 | 7/1964 | Greutman | 330—29 |
| 3,210,683 | 10/1965 | Pay. | |

JOHN KOMINSKI, *Primary Examiner.*

JAMES B. MULLINS, *Assistant Examiner.*

U.S. Cl. X.R.

330—22, 29, 38